(12) United States Patent
Zhou et al.

(10) Patent No.: US 9,959,927 B2
(45) Date of Patent: May 1, 2018

(54) MULTI-STEP VOLTAGE FOR FORMING RESISTIVE ACCESS MEMORY (RRAM) CELL FILAMENT

(71) Applicants: Silicon Storage Technology, Inc., San Jose, CA (US); Agency For Science, Technology And Research, Connexis (SG)

(72) Inventors: Feng Zhou, Fremont, CA (US); Xian Liu, Sunnyvale, CA (US); Nhan Do, Saratoga, CA (US); Hieu Van Tran, San Jose, CA (US); Hung Quoc Nguyen, Fremont, CA (US); Mark Reiten, Alamo, CA (US); Zhixian Chen, Fusionopolis Way (SG); Wang Xinpeng, Teban Gardens Road (SG); Guo-Qiang Lo, Science Park II (SG)

(73) Assignee: Silicon Storage Technology, Inc., San Jose, CA (US)

( * ) Notice: Subject to any disclaimer, the term of this patent is extended or adjusted under 35 U.S.C. 154(b) by 0 days. days.

(21) Appl. No.: 15/404,087

(22) Filed: Jan. 11, 2017

(65) Prior Publication Data
US 2017/0316823 A1   Nov. 2, 2017

(30) Foreign Application Priority Data
Mar. 4, 2016   (SG) .................. 10201601703U

(51) Int. Cl.
*G11C 16/04*   (2006.01)
*G11C 13/00*   (2006.01)
*H01L 45/00*   (2006.01)

(52) U.S. Cl.
CPC ........ *G11C 13/0007* (2013.01); *H01L 45/145* (2013.01); *H01L 45/16* (2013.01)

(58) Field of Classification Search
CPC . G11C 13/0069; G11C 13/003; G11C 13/004; G11C 17/165
See application file for complete search history.

(56) References Cited

U.S. PATENT DOCUMENTS

| 8,995,169 B1 | 3/2015 | Bandyopadhyay |
| 2008/0062740 A1 | 3/2008 | Baek et al. |
| 2008/0084751 A1 | 4/2008 | Li et al. |
| 2008/0151601 A1 | 6/2008 | Kang et al. |

(Continued)

FOREIGN PATENT DOCUMENTS

CN   102610272   7/2012

OTHER PUBLICATIONS

"Overshoot (signal)" Oct. 19, 2011, Wayback Machine Internet Archive; https://web.archive.org/web/20111019232043/http://en.wikipedia.org/wiki/Overshoot_(signal).

(Continued)

*Primary Examiner* — Tuan T Nguyen
(74) *Attorney, Agent, or Firm* — DLA Piper LLP (US)

(57) ABSTRACT

A memory device and method comprising a metal oxide material disposed between and in electrical contact with first and second conductive electrodes, and a voltage source configured to apply a plurality of voltage pulses spaced apart in time across the first and second electrodes. For each one of the voltage pulses, an amplitude of the voltage increases during the voltage pulse.

32 Claims, 13 Drawing Sheets

(56) References Cited

U.S. PATENT DOCUMENTS

| | | | |
|---|---|---|---|
| 2008/0316809 A1* | 12/2008 | Herner | G11C 11/5692 365/175 |
| 2011/0051504 A1 | 3/2011 | Thorp et al. | |
| 2011/0205782 A1 | 8/2011 | Costa et al. | |
| 2011/0305066 A1 | 12/2011 | Nazarian et al. | |
| 2012/0026778 A1 | 2/2012 | Maejima | |
| 2013/0301337 A1 | 11/2013 | Kamalanathan et al. | |
| 2014/0063896 A1 | 3/2014 | Ahn | |
| 2014/0078811 A1* | 3/2014 | Kawai | G11C 13/00 365/148 |

OTHER PUBLICATIONS

Tang, et al., "A Novel RRAM StackWith $TaO_x/HfO_y$ Double-Switching-Layer Configuration Showing Low Operation Current Through Complimentary Switching of Back-to-Back Connected Subcells," IEEE, 2014, pp. 627-629.

Lee, et al., "Low Power and High Speed Bipolar Switching With a Thin Reactive Ti Buffer Layer in Robust $HfO_2$ Based RRAM," IEEE Catalog No. CFP08IED-CDR, 2008, 5 pages.

Goux, et al., "Ultralow sub-500nA operating current high-performance TiN\$Al_2O_3$\$HfO_2$\Hf\TiN bipolar RRAM achieved through understanding-based stack-engineering," 2 pages.

* cited by examiner

MULTI-STEP VOLTAGE FOR FORMING RESISTIVE ACCESS MEMORY (RRAM) CELL FILAMENT

CROSS-REFERENCE

This application claims priority to Singaporean Patent Application No. 10201601703U filed on Mar. 4, 2016 and titled "Multi-Step Voltage For Forming Resistive Random Access Memory (RRAM) Cell Filament" which is incorporated herein by reference.

FIELD OF THE INVENTION

The present invention relates to non-volatile memory, and more specifically to resistive random access memory.

BACKGROUND OF THE INVENTION

Resistive random access memory (RRAM) is a type of nonvolatile memory. Generally, RRAM memory cells each include a resistive dielectric material layer sandwiched between two conductive electrodes. The dielectric material is normally insulating. However, by applying the proper voltage across the dielectric layer, a conduction path (typically referred to as a filament) can be formed through the dielectric material layer. Once the filament is formed, it can be "reset" (i.e., broken or ruptured, resulting in a high resistance across the RRAM cell) and set (i.e., re-formed, resulting in a lower resistance across the RRAM cell), by applying the appropriate voltages across the dielectric layer. The low and high resistance states can be utilized to indicate a digital signal of "1" or "0" depending upon the resistance state, and thereby provide a reprogrammable non-volatile memory cell that can store a bit of information.

FIG. 1 shows a conventional configuration of an RRAM memory cell 1. The memory cell 1 includes a resistive dielectric material layer 2 sandwiched between two conductive material layers that form top and bottom electrodes 3 and 4, respectively.

FIGS. 2A-2D show the switching mechanism of the dielectric material layer 2. Specifically, FIG. 2A shows the resistive dielectric material layer 2 in its initial state after fabrication, where the layer 2 exhibits a relatively high resistance. FIG. 2B shows the formation of a conductive filament 7 through the layer 2 by applying the appropriate voltage across the layer 2. The filament 7 is a conductive path through the layer 2, such that the layer exhibits a relatively low resistance across it (because of the relatively high conductivity of the filament 7). FIG. 2C shows the formation of a rupture 8 in filament 7 caused by the application of a "reset" voltage across the layer 2. The area of the rupture 8 has a relatively high resistance, so that layer 2 exhibits a relatively high resistance across it. FIG. 2D shows the restoration of the filament 7 in the area of the rupture 8 caused by the application of a "set" voltage across layer 2. The restored filament 7 means the layer 2 exhibits a relatively low resistance across it. The relatively low resistance of layer 2 in the "formation" or "set" states of FIGS. 2B and 2D respectively can represent a digital signal state (e.g. a "1"), and the relatively high resistance of layer 2 in the "reset" state of FIG. 2C can represent a different digital signal state (e.g. a "0"). The reset voltage (which breaks the filament) can have a polarity opposite that of the filament formation and the set voltages, but it can also have the same polarity. The RRAM cell 1 can repeatedly be "reset" and "set," so it forms an ideal reprogrammable nonvolatile memory cell.

One of the most critical operations involves the initial formation of the filament, as it will define the switching characteristics of the memory cell (e.g. operational power, device-to-device resistance variation, etc.). The voltage and current needed to form the filament are relatively high (i.e. significantly higher than the voltages needed to set and reset the memory cell). Using a filament forming voltage that is too low will not adequately form the filament. Using an excessive filament forming voltage could cause uncontrolled filament formation which can damage the device and result in inferior resistance switching behaviors. Therefore, there is a need for a reliable and effective technique for initially forming the filaments in RRAM devices.

BRIEF SUMMARY OF THE INVENTION

The aforementioned problems and needs are addressed by a method of forming a conductive filament in metal oxide material disposed between and in electrical contact with first and second conductive electrodes. The method comprises applying a plurality of voltage pulses spaced apart in time across the first and second electrodes. For each one of the voltage pulses, an amplitude of the voltage increases during the voltage pulse.

A memory device comprises a metal oxide material disposed between and in electrical contact with first and second conductive electrodes, and a voltage source configured to apply a plurality of voltage pulses spaced apart in time across the first and second electrodes. For each one of the voltage pulses, an amplitude of the voltage increases during the voltage pulse.

Other objects and features of the present invention will become apparent by a review of the specification, claims and appended figures.

DETAILED DESCRIPTION OF THE INVENTION

The present invention is an improved technique for initially forming filaments in RRAM devices. The technique involves voltage pulses that combine increasing voltages within each pulse, and increasing the maximum achieved voltage pulse-to-pulse, and in combination with controlling and shaping the forming current in a pre-determined manner, to gently form the filaments without excessive voltages that will damage the memory cell. The application of the pulses can end at a preset value, or can end after the cell reaches a desired resistance level.

Figure 1:
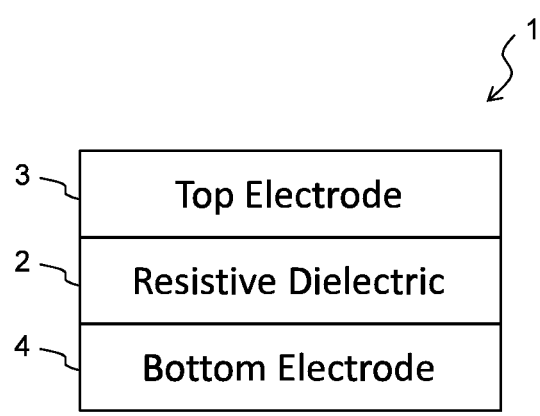
FIG. 1 is a side cross sectional view of a conventional Resistive Random Access Memory (RRAM) cell.
Figure 2A:
FIG. 2A is a side cross sectional view of the resistive dielectric layer of the conventional RRAM cell in its initial state.
Figure 2B:
FIG. 2B is a side cross sectional view of the resistive dielectric layer of the conventional RRAM cell in its formed state.
Figure 2C:
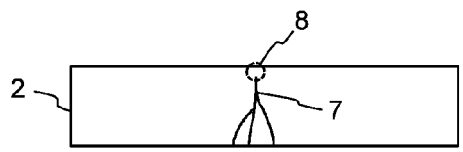
FIG. 2C is a side cross sectional view of the resistive dielectric layer of the conventional RRAM cell in its reset state.
Figure 2D:
FIG. 2D is a side cross sectional view of the resistive dielectric layer of the conventional RRAM cell in its set state.
Figure 3:
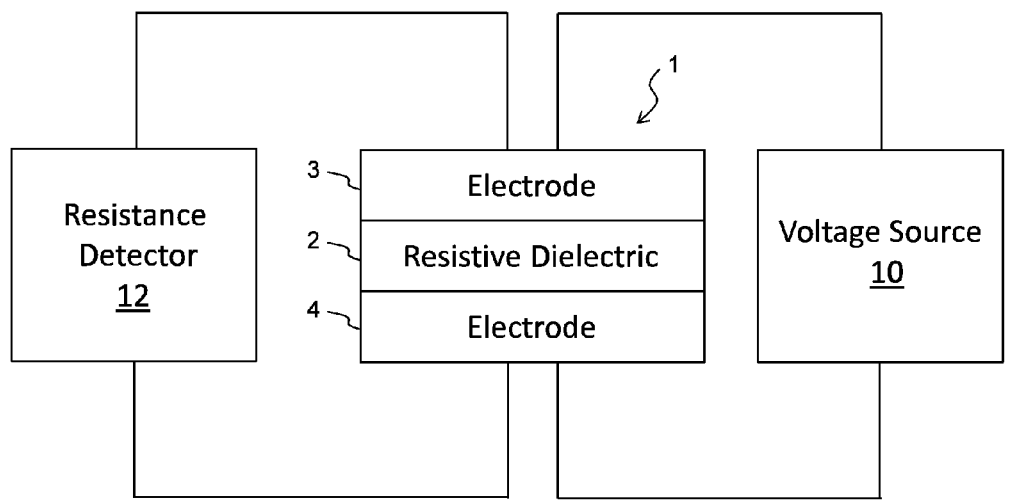
FIG. 3 is a schematic diagram showing the basic components of the RRAM memory device.

FIG. 3 illustrates the high level basic structure of an RRAM memory device, which includes the previously described RRAM cell 1, a voltage source 10 for applying voltages across the memory cell 1 for filament formation, cell reset and cell set. A resistance detector 12 can be used to measure the electrical resistance across the RRAM cell 1 for filament formation and determining the state of the RRAM cell 1 (i.e. reading the cell). It should be appreciated that while FIG. 3 illustrates only a single RRAM cell 1, the voltage source 10 and resistance detector 12 are connected to and operate on an array of RRAM cells 1. It should also be appreciated at the voltage source 10 and resistance detector 12 could be formed as a single integrated device. Preferably, the electrodes 3 and 4 are made of a metal material (e.g., Pt, Ti, TiN, Ru, Ni, TaN, W, etc.) and resistive dielectric layer 2 is made of a metal oxide (e.g., HfOx, TaOx, TiOx, WOx, Vox, CuOx, etc.). Alternatively, resistive dielectric layer 2 can be a composite of discrete sub-layers (e.g. layer 2 could be multiple layers, such as a Hf layer disposed between a TaOx layer and a HfOx layer).

Figure 4:
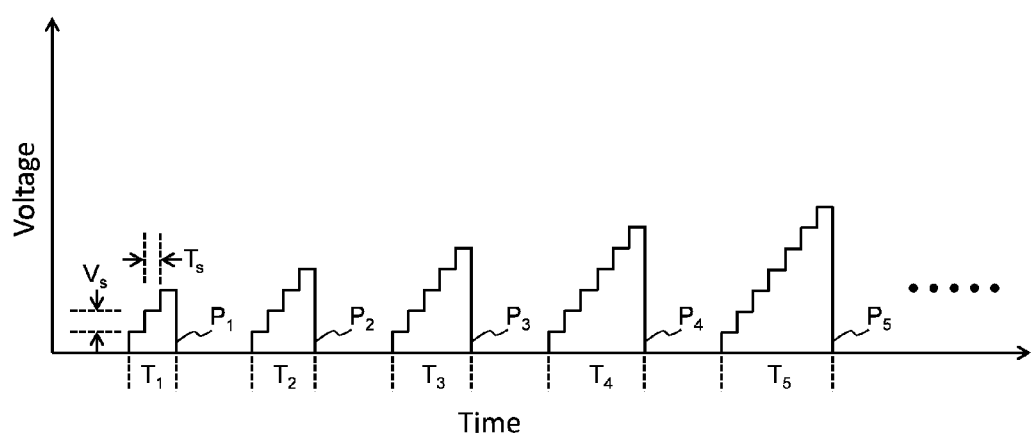
FIG. 4 is a graph illustrating the waveform of the voltage pulses applied to form the filament in the RRAM cell.

FIG. 4 illustrates the voltage pulses P applied across electrodes 3 and 4 by voltage source 10 for forming the filament in the resistive dielectric layer 2. Within each pulse P, the voltage increases in increments (i.e., voltage steps $V_s$), each with an increment duration $T_s$, in a stair-step fashion. Each successive pulse P reaches a higher voltage before ending, and has a longer duration T. For example, pulse $P_1$ has a first incremental voltage $V_s$ applied for an incremental time $T_s$. Then the applied voltage is increased by an additional $V_s$ and this second incremental voltage is applied for incremental time $T_s$. Then the applied voltage is increased again by an additional $V_s$ and this third incremental voltage is applied for incremental time $T_s$. Then pulse $P_1$ ends, having a total time duration $T_1$. Pulse $P_2$ is the same as pulse $P_1$ except it has an additional incremental voltage raised by another $V_s$ which is applied for incremental time $T_s$, so that the overall duration $T_2$ of pulse $P_2$ is greater than the duration $T_1$ of pulse $P_1$. This iteration continues until the filament formation is completed. The filament forming process ends by reaching a predetermined number of pulses P, or the resistance of the resistive dielectric layer 2 as measured between pulses P by resistance detector 12 reaches a desired value which verifies that the filament has been properly formed (i.e. forming verification), or by sensing that the electrical current during an applied voltage source exceeds a predetermined value (also forming verification), or a combination of the above (i.e. cease the process by reaching the predetermined number of pulses unless the measured resistance drops below a predetermined threshold first or the electrical current exceeds a predetermined value first).

Figure 5:
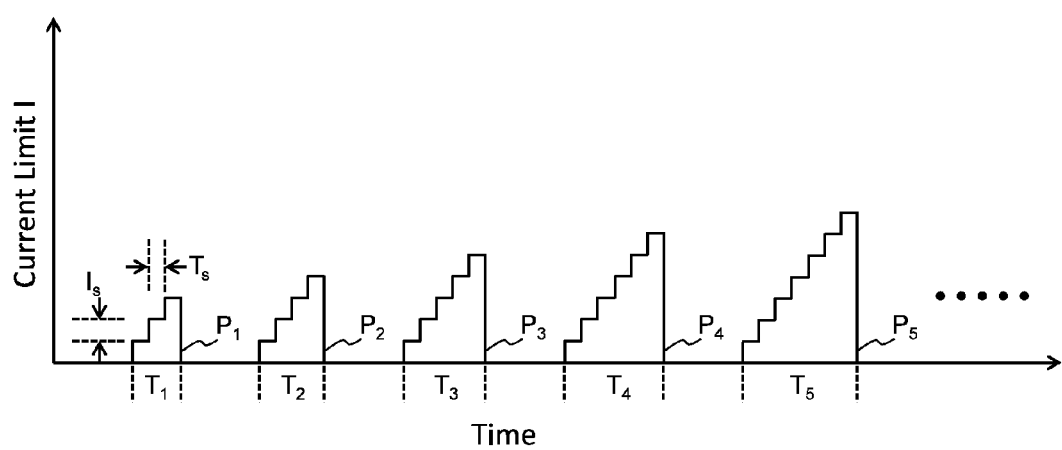
FIG. 5 is a graph illustrating current limits applied to the voltage pulses of FIG. 4.
Figure 6:
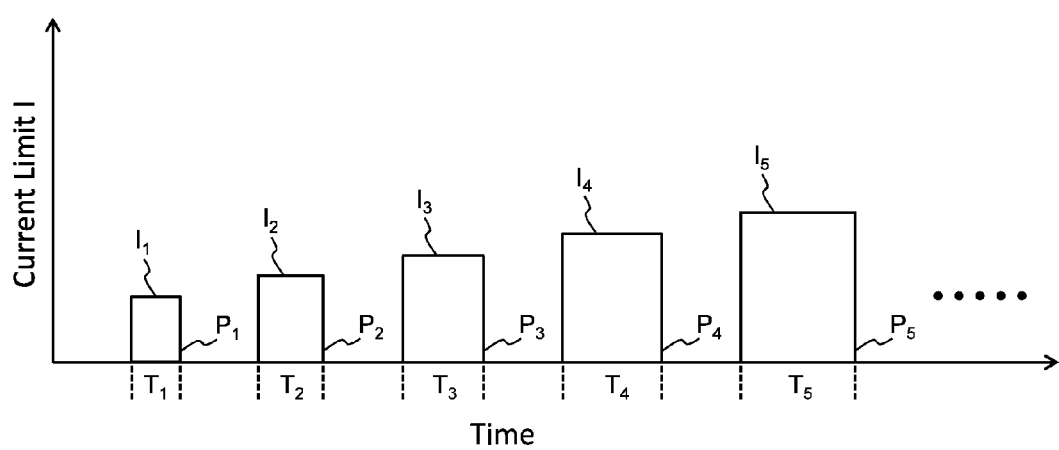
FIG. 6 is a graph illustrating current limits applied to the voltage pulses of FIG. 4.

Another limitation that can be placed on the pulses is based upon electrical current. Specifically, excessive electrical current through resistive dielectric layer 2 can cause uncontrolled filament formation. Therefore, a maximum electrical current limit I (commonly referred to as an electrical current limit, current limit and current compliance limit) can be implemented by voltage source 10 for each pulse, whereby the electrical current for any given pulse cannot exceed the current limit I should the current reach that limit. The current limits I for each pulse can be the same, or can vary (e.g. can increase pulse to pulse). For example, as shown in FIG. 5, each of the voltage pulses in FIG. 4 are limited by corresponding current limits that increase for each successive incremental voltage within each pulse. Alternately, each pulse could have just a single current limit I as shown in FIG. 6, where the current limit increases for each successive pulse. By slowly raising the current limit for each pulse (or within each pulse), excessive electrical currents that could cause uncontrollable filament formation can be avoided.

As a non-limiting example, current limit I(n) for any given pulse n can be determined by the following equation: $I(n)=k*I(n-1)$ where k is a factor specific to layer stack 3/2/4 and $I(n-1)$ is the current limit for the preceding pulse. In another non-limiting embodiment, the current limit I(n) can be determined by the following equation: $I(n)=n*k$ with k being specific to layer stack 3/2/4. Alternately, the current limit can be determined by a combination of the above approaches.

Each of the pulses P contributes to the formation of the filament. However, by slowly forming the filament with incremental voltage increases within each pulse, and slowly increasing the maximum attained voltage and duration of each successive pulse, with relaxation times between pulses where no voltage is applied, along with incrementally increasing limits on electrical current, it has been determined that more reliable filament formation, and thus more controlled and reliable memory cell performance, can be achieved.

Figure 7:
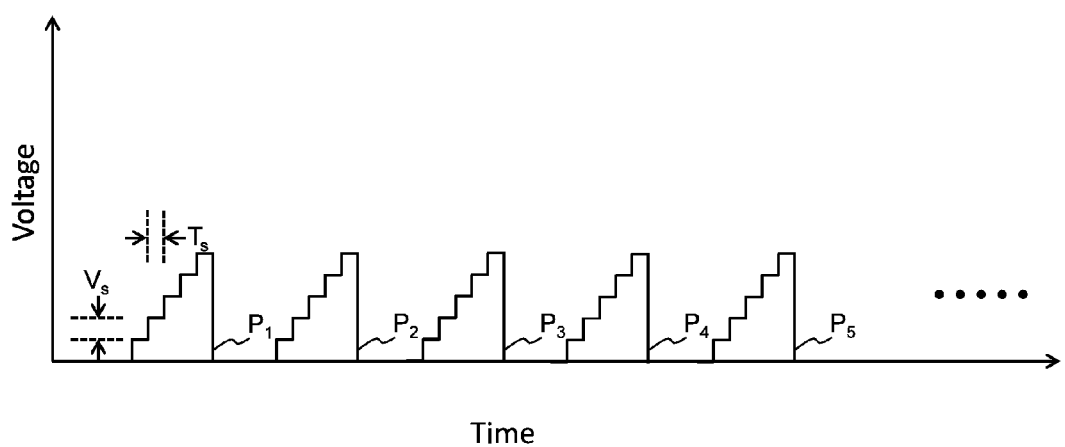
FIG. 7 is a graph illustrating an alternate waveform of the voltage pulses applied to form the filament in the RRAM cell.
Figure 8:
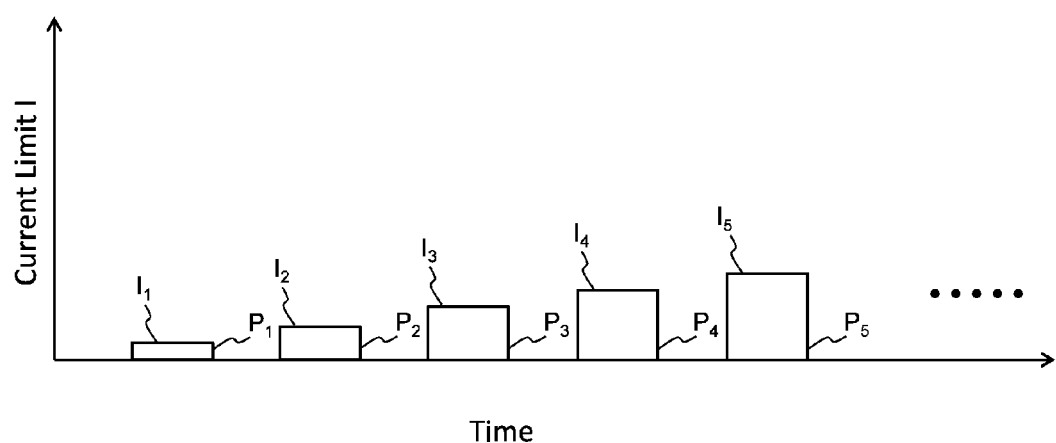
FIG. 8 is a graph illustrating current limits applied to the voltage pulses of FIG. 7.

FIG. 7 illustrates an alternate waveform of pulses P that can be applied across electrodes 3 and 4 for forming the filament. In this waveform, the voltage amplitudes and duration of each pulse P are the same. But, the current limit I for each pulse P is gradually increased as shown in FIG. 8, until the filament is properly formed. It is the slowly incremental increasing of the current limit for each successive pulse (or each successive step within each pulse) that ensures the filament is properly formed. Alternately, if the filament is not properly formed after a certain number of fixed voltage pulses, the maximum voltage for subsequent pulses could be increased.

Figure 9:
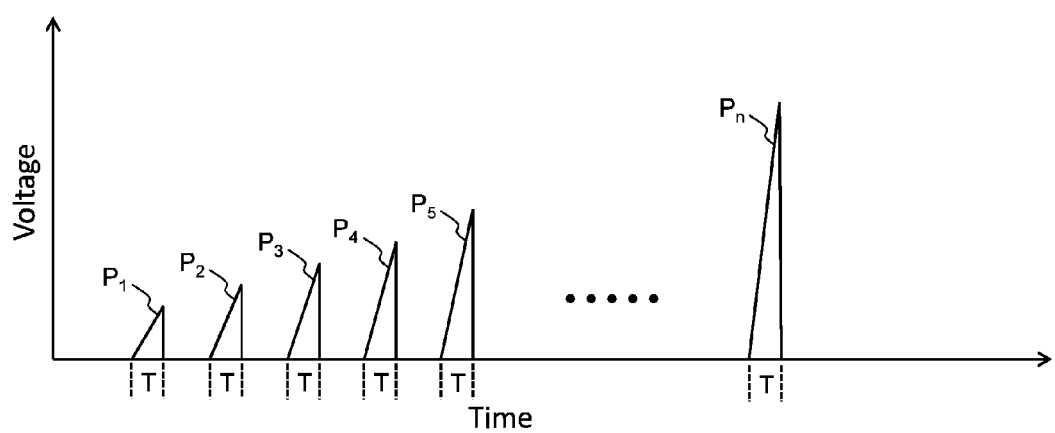
FIG. 9 is a graph illustrating an alternate waveform of the voltage pulses applied to form the filament in the RRAM cell.

FIG. 9 illustrates an alternate waveform of pulses P that can be applied across electrodes 3 and 4 for forming the filament. In this waveform, each pulse P includes a gradually increasing voltage starting from zero (as opposed to discrete steps described above). Each pulse has the same duration T, but each successive pulse ramps the voltage faster and reaches a higher maximum voltage as compared to the previous pulse P. A current limit can be applied to these pulses, which is the same pulse to pulse, or which varies pulse to pulse as described above.

Figure 10:
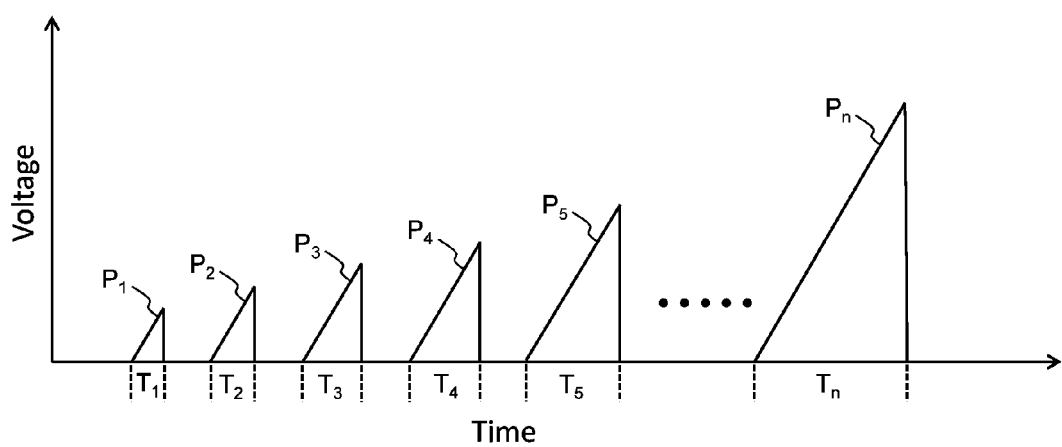
FIG. 10 is a graph illustrating an alternate waveform of the voltage pulses applied to form the filament in the RRAM cell.

FIG. 10 illustrates an alternate waveform of pulses P that can be applied across electrodes 3 and 4 for forming the filament. In this waveform, each pulse P includes a gradually increasing voltage starting from zero. The rate at which the voltage ramps up is the same for each pulse. Each successive pulse has a duration T greater than the previous pulse, so each successive pulse reaches a higher maximum voltage as compared to the previous pulse P. A current limit can be applied to these pulses, which is the same pulse to pulse, or which varies pulse to pulse as described above.

Figure 11:
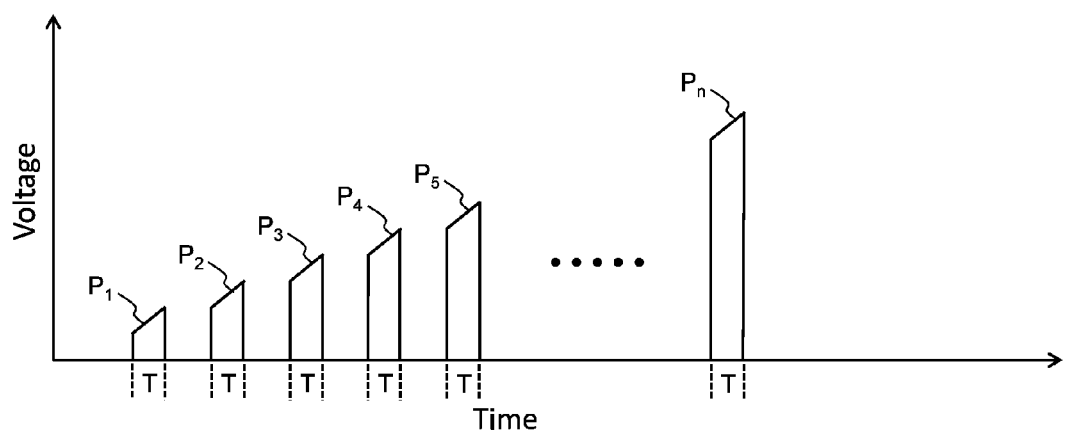
FIG. 11 is a graph illustrating an alternate waveform of the voltage pulses applied to form the filament in the RRAM cell.

FIG. 11 illustrates an alternate waveform of pulses P that can be applied across electrodes 3 and 4 for forming the filament. In this waveform, each pulse P includes a gradually increasing voltage. The rate at which the voltage ramps up is the same for each pulse, and preferably each successive pulse begins at the voltage level where the previous pulse ended. The pulses in this embodiment all have the same duration T, but this duration time could vary as well. A current limit can be applied to these pulses, which is the same pulse to pulse, or which varies pulse to pulse as described above.

Figure 12:
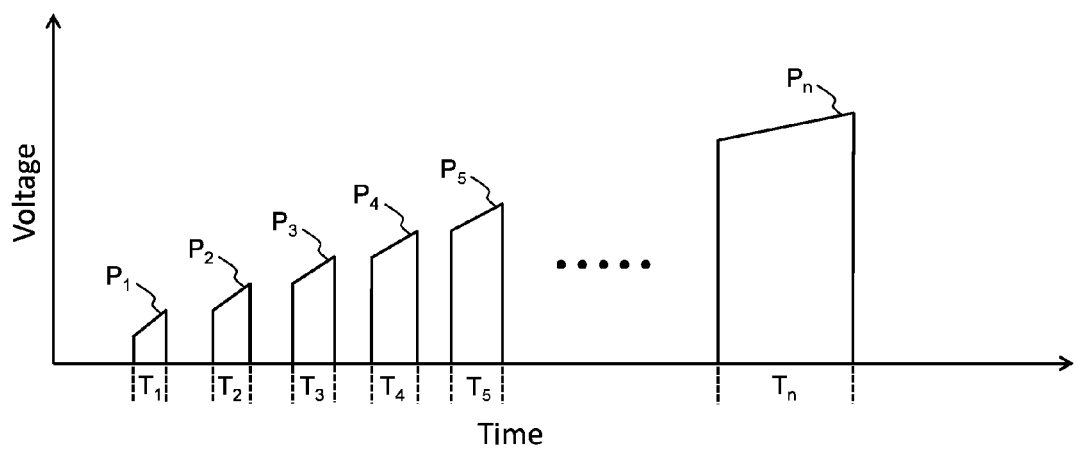
FIG. 12 is a graph illustrating an alternate waveform of the voltage pulses applied to form the filament in the RRAM cell.

FIG. 12 illustrates an alternate waveform of pulses P that can be applied across electrodes 3 and 4 for forming the filament. In this waveform, each pulse P includes a gradually increasing voltage. The rate at which the voltage ramps up less for each successive pulse, but the duration T of each pulse increases so as to allow each successive pulse to begins at the voltage level where the previous pulse ended. A current limit can be applied to these pulses, which is the same pulse to pulse, or which varies pulse to pulse as described above.

Figure 13:
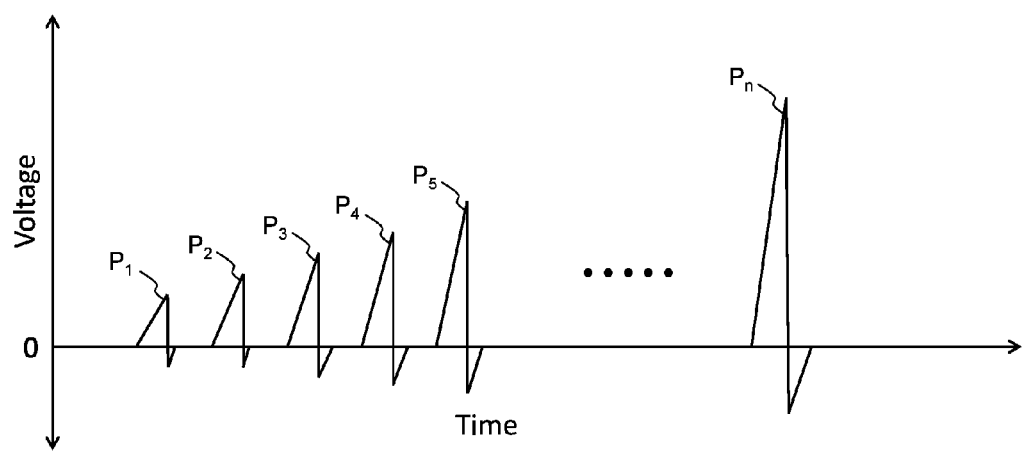
FIG. 13 is a graph illustrating an alternate waveform of the voltage pulses applied to form the filament in the RRAM cell.

FIG. 13 illustrates an alternate waveform of pulses P that can be applied across electrodes 3 and 4 for forming the filament. This waveform is similar to that of FIG. 5, but with the addition of a small reverse bias voltage at the end of each pulse P (i.e. a voltage of reverse polarity but smaller amplitude compared to that of most the pulse P). The reverse bias helps stabilize the oxygen vacancies that form the filament. The reverse bias voltages can vary from pulse to pulse in amplitude and/or duration (e.g. the amplitude of reverse bias voltages can increase from pulse to pulse as shown in FIG. 9). The reverse bias voltage of this waveform can be added to any of the previously discussed waveforms. A current limit can be applied to these pulses, which is the same pulse to pulse, or which varies pulse to pulse as described above.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a conductive filament in metal oxide material disposed between and in electrical contact with first and second conductive electrodes, the method comprising:
    applying a plurality of voltage pulses spaced apart in time across the first and second electrodes;
    wherein for each one of the voltage pulses, an amplitude of the voltage increases during the voltage pulse.

2. The method of claim 1, wherein for each of the voltage pulses, a maximum of the voltage amplitude exceeds that of any of the plurality of voltage pulses preceding the one voltage pulse.

3. The method of claim 1, wherein for each of the voltage pulses, further comprising:
    limiting electrical current applied across the first and second electrodes during the voltage pulse to a current limit.

4. The method of claim 3, wherein for each one of the voltage pulses, the current limit exceeds that of any of the plurality of voltage pulses preceding the one voltage pulse.

5. The method of claim 4, wherein for each one of the voltage pulses, the current limit of an immediately successive voltage pulse is greater than that of the one voltage pulse by a multiplier factor.

6. The method of claim 1, wherein for each one of the voltage pulses, the amplitude of the voltage increases in discrete steps.

7. The method of claim 6, wherein for each one of the voltage pulses, a number of the discrete steps exceeds that of any of the plurality of voltage pulses preceding the one voltage pulse.

8. The method of claim 1, wherein for each one of the voltage pulses, a duration of the one voltage pulse exceeds that of any of the plurality of voltage pulses preceding the one pulse.

9. The method of claim 1, wherein all of the plurality of voltage pulses have a same duration.

10. The method of claim 1, wherein for each one of the voltage pulses, the amplitude of the voltage increases gradually.

11. The method of claim 10, wherein for each one of the voltage pulses, the gradual increase of the voltage amplitude is at a rate that exceeds that of any of the plurality of voltage pulses preceding the one voltage pulse.

12. The method of claim 10, wherein for each one of the voltage pulses, the gradual increase of the voltage amplitude is at a rate that is the same as that of all of the others of the plurality of voltage pulses.

13. The method of claim 2, wherein for each one of the voltage pulses, the one voltage pulse has a beginning voltage amplitude that is equal to an ending voltage amplitude of any of the plurality of voltage pulses immediately preceding the one voltage pulse.

14. The method of claim 1, wherein each of the voltage pulses ends with a voltage of reverse polarity.

15. The method of claim 1, further comprising:
measuring a resistance of the metal oxide material after each of the plurality of voltage pulses; and
ceasing the applying of the voltage pulses in response to the measured resistance being below a predetermined threshold.

16. The method of claim 1, further comprising:
ceasing the applying of the voltage pulses in response to an electrical current applied across the first and second electrodes during one of the voltage pulses exceeding a predetermined value.

17. A memory device comprising:
a metal oxide material disposed between and in electrical contact with first and second conductive electrodes;
a voltage source configured to apply a plurality of voltage pulses spaced apart in time across the first and second electrodes;
wherein for each one of the voltage pulses, an amplitude of the voltage increases during the voltage pulse.

18. The memory device of claim 17, wherein for each one of the voltage pulses, a maximum of the amplitude exceeds that of any of the plurality of voltage pulses preceding the one voltage pulse.

19. The memory device of claim 17, wherein the voltage source is further configured to, for each of the voltage pulses, limit electrical current applied across the first and second electrodes during the voltage pulse to a current limit.

20. The memory device of claim 19, wherein for each one of the voltage pulses, the current limit exceeds that of any of the plurality of voltage pulses preceding the one voltage pulse.

21. The memory device of claim 20, wherein for each one of the voltage pulses, the current limit of an immediately successive voltage pulse is greater than that of the one voltage pulse by a multiplier factor.

22. The memory device of claim 17, wherein for each one of the voltage pulses, the amplitude of the voltage increases in discrete steps.

23. The memory device of claim 22, wherein for each one of the voltage pulses, a number of the discrete steps exceeds that of any of the plurality of voltage pulses preceding the one voltage pulse.

24. The memory device of claim 17, wherein for each one of the voltage pulses, a duration of the one voltage pulse exceeds that of any of the plurality of voltage pulses preceding the one voltage pulse.

25. The memory device of claim 17, wherein all of the plurality of voltage pulses have a same duration.

26. The memory device of claim 17, wherein for each one of the voltage pulses, the amplitude of the voltage increases gradually.

27. The memory device of claim 26, wherein for each one of the voltage pulses, the gradual increase of the voltage amplitude is at a rate that exceeds that of any of the plurality of voltage pulses preceding the one voltage pulse.

28. The memory device of claim 26, wherein for each one of the voltage pulses, the gradual increase of the voltage amplitude is at a rate that is the same as that of all of the others of the plurality of voltage pulses.

29. The memory device of claim 18, wherein for each one of the voltage pulses, the one voltage pulse has a beginning voltage amplitude that is equal to an ending voltage amplitude of any of the plurality of voltage pulses immediately preceding the one voltage pulse.

30. The memory device of claim 17, wherein each of the voltage pulses ends with a voltage of reverse polarity.

31. The memory device of claim 17, further comprising:
a resistance detector for measuring a resistance of the metal oxide material after each of the plurality of voltage pulses, wherein the voltage source is configured to cease the applying of the voltage pulses in response to the measured resistance being below a predetermined threshold.

32. The memory device of claim 17, wherein the voltage source is configured to cease the applying of the voltage pulses in response an electrical current applied across the first and second electrodes during one of the voltage pulses exceeding a predetermined value.

* * * * *